United States Patent [19]
Bourbina et al.

[11] Patent Number: 5,108,720
[45] Date of Patent: Apr. 28, 1992

[54] FLOAT ZONE PROCESSING OF PARTICULATE SILICON

[75] Inventors: Michael Bourbina; James R. McCormick, both of Midland; Scott A. Wheelock, Bay City, all of Mich.

[73] Assignee: Hemlock Semiconductor Corporation, Hemlock, Mich.

[21] Appl. No.: 702,541

[22] Filed: May 20, 1991

[51] Int. Cl.⁵ .............................................. B01D 9/00
[52] U.S. Cl. ............................. 422/253; 156/620.73; 156/620.75; 156/DIG. 64; 156/DIG. 115; 422/250
[58] Field of Search ............... 156/620.73, 620.75, 156/DIG. 64, DIG. 115; 422/250, 253

[56] References Cited

U.S. PATENT DOCUMENTS

| | | | |
|---|---|---|---|
| 2,907,642 | 10/1959 | Rummel | 422/247 |
| 2,930,098 | 3/1960 | Emeis | 65/18.4 |
| 2,993,762 | 7/1961 | Sterling et al. | 422/250 |
| 3,055,741 | 9/1962 | MacInnis et al. | 156/DIG. 64 |
| 3,156,533 | 11/1964 | Imber | 422/247 |
| 3,293,001 | 12/1966 | Spielmann et al. | 422/250 |
| 3,442,622 | 5/1969 | Monnier et al. | 156/620.73 |
| 4,207,360 | 6/1980 | Padovani | 156/DIG. 64 |
| 4,868,013 | 9/1989 | Allen | 423/350 |

FOREIGN PATENT DOCUMENTS 1081827  9/1967  United Kingdom.

Primary Examiner—Robert Kunemund
Assistant Examiner—Felisa Garrett
Attorney, Agent, or Firm—William F. Boley

[57] ABSTRACT

The present invention is a float-zone process for forming particulate silicon into monocrystalline silicon. The process employs a reusable silicon conduit having a lower end heated to form a melt zone and an upper end provided with a means for delivering a controlled amount of particulate silicon to the melt zone. A monocrystal silicon seed is used to pull a monocrystalline silicon ingot from the melt zone and particulate silicon is added to the melt zone to replenish silicon removed as monocrystalline silicon.

9 Claims, 1 Drawing Sheet

FLOAT ZONE PROCESSING OF PARTICULATE SILICON

BACKGROUND OF THE INVENTION

The present invention is a float-zone process for forming particulate silicon into monocrystalline silicon. The process employs a reusable silicon conduit having a lower end heated to form a melt zone and an upper end provided with a means for delivering a controlled amount of particulate silicon to the melt zone. A monocrystal silicon seed is used to pull a monocrystalline silicon ingot from the melt zone and particulate silicon is added to the melt zone to replenish silicon removed as monocrystalline silicon.

There are two commonly employed methods for producing semiconductor-grade monocrystalline silicon. One method, known as the Czochralski method, employs a silicon melt contained in a suitable crucible from which a monocrystalline silicon ingot is pulled. The purity of monocrystalline silicon prepared by this method is compromised by impurities occurring as a result of deterioration of the crucible wall and leaching from the crucible wall. The second common method for producing semiconductor-grade monocrystalline silicon is the float-zone process. In this process, a rod of polycrystalline silicon is converted to monocrystalline silicon by passing a molten zone along the length of the rod. This process avoids the crucible contamination problem associated with the Czochralski process, but is limited by the ability to produce polycrystalline rods that are crack-free and of the desired size.

A crucible-free process for float-zone processing particulate silicon into a monocrystalline element can overcome the cited limitations of the Czochralski process and the float-zone process using solid polycrystalline silicon rods. Therefore, semiconductor-grade monocrystalline silicon of greater purity can be produced, than is possible by the Czochralski process, and the expense and size limitations of polycrystalline silicon rods can be avoided.

British patent No 1,081,827, Published Sep. 6, 1967, describes the basic float zone process for processing a polycrystalline silicon rod into a monocrystalline silicon rod. A small portion of the length of the polycrystalline silicon rod is heated so that a melt zone is formed and by relative movement between the heating source and the rod, the molten zone is passed through the rod, from one end to the other. If a monocrystal silicon, seed is attached to one end of a rod, the whole rod starting from this seed crystal can be converted into a single crystal.

Rummel, U.S. Pat. No. 2,907,642, issued Oct. 6, 1959, describes a process where powdered silicon is blown into a melt zone to be incorporated therein and contribute to the formation of a monocrystalline silicon rod.

Emeis, U.S. Pat. No. 2,930,098, issued Mar. 29, 1960, proposed preparing particulate samples for possible float-zone treatment by sintering the particles in a quartz tube. The lower temperature required for sintering is reported to reduce contamination of the silicon due to deterioration of the quartz tube.

Imber, U.S. Pat. No. 3,156,533, issued Nov. 10, 1964, describes a process for converting powdered silicon into monocrystalline silicon with minimal contamination. The described invention relates to an apparatus for growing crystals which provides a conical crucible supported within a cylindrical chamber, and a powder dispensing means, or hopper suspended in the upper part of the chamber directly above the conically shaped crucible. A discharge opening in the apex of the conically shaped crucible communicates with the lower part of the chamber where a seed crystal is supported directly beneath the opening. In operating the device, powder spills from the hopper onto the hot conical crucible where the powder melts and collects in a molten pool over the discharge opening of the cone. Drops of molten silicon form and fall through the opening to the crystal grown below.

It is an objective of the instant process to provide a crucible-free process for converting polycrystalline silicon particles into monocrystalline silicon, thereby avoiding the potential contamination associated with the use of a crucible to contain a silicon melt. A second object is to provide a process that avoids the difficult and expensive process of preparing polycrystalline silicon elements for float-zone processing. A third objective is to provide a process where silicon particles can be directly processed by a float-zone process without sintering or other processing to create a formed element. A fourth objective is to provide a process where the section of the chamber of the zoning apparatus used for feed material can be reduced, thereby providing the potential to grow longer monocrystalline silicon ingots in a size restrained facility. A fifth objective is to provide a process were the monocrystalline silicon ingot is not limited in size by the availability of polycrystalline silicon rods suitable for float-zone processing.

SUMMARY OF THE INVENTION

Figure 1:
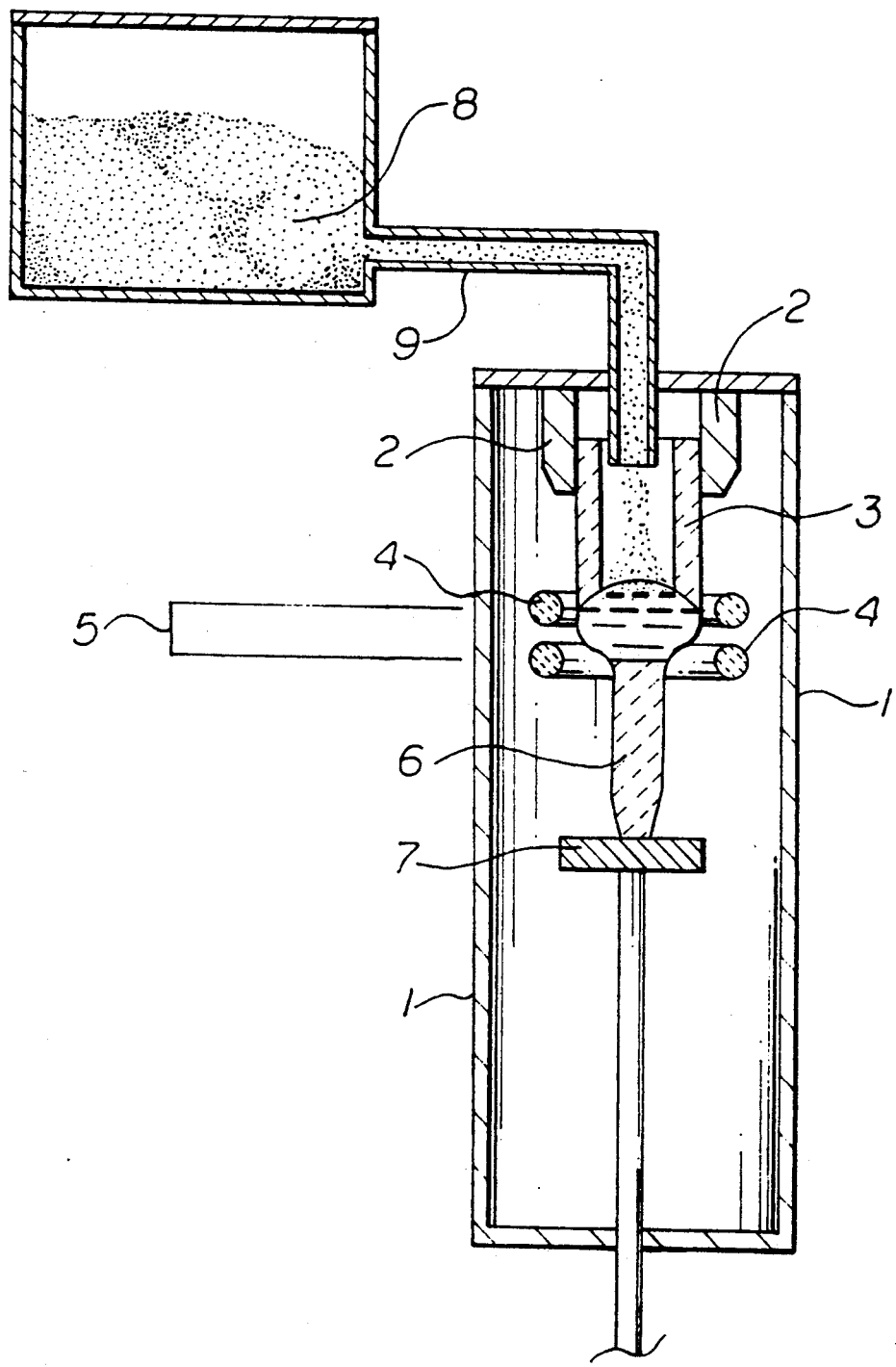
FIG. 1 is a schematic representation of the process of the instant invention. The process is conducted in zoner housing 1, which is capable of retaining a gas atmosphere under pressure or a vacuum. Zoner housing 1 contains in the upper portion chuck 2 for holding silicon conduit 3. The lower portion of silicon conduit 3 is encircled by inductive heating coil 4 to form melt zone 5. Extending from melt zone 5 is monocrystalline silicon element 6. The end of monocrystalline silicon element 6, distal to melt zone 5, is contacted with a seed crystal of monocrystalline silicon supported on moveable element 7. Particulate silicon is fed from hopper 8 through connecting conduit 9 and silicon conduit 3 to melt zone 5.

The present invention is a float-zone process for forming particulate silicon into monocrystalline silicon. The process employs a reusable silicon conduit having a lower end inductively heated to form a melt zone and an upper end provided with a means for delivering a controlled amount of particulate silicon to the silicon conduit. A monocrystal silicon seed is used to pull a monocrystalline silicon ingot from the melt zone and particulate silicon is added to the melt zone, via the silicon conduit, to replenish removed silicon.

DESCRIPTION OF THE INVENTION

The present invention is a float-zone process for preparation of monocrystalline silicon from particulate silicon. The process comprises:

(A) feeding particulate silicon, through a silicon conduit contacted with a silicon melt zone, at a feed rate controlled to maintain an essentially constant volume for the silicon melt zone, (B) contacting the silicon melt zone with a monocrystal silicon seed, and (C) withdrawing the monocrystal silicon seed from the silicon melt zone, at a controlled rate effective for growing a monocrystalline silicon ingot from the silicon melt zone.

The float-zone process for preparing monocrystalline silicon from polycrystalline silicon is well known, for example, see British Patent No. 1,081,827, Published Sep. 6, 1967. The float-zone process, as typically practiced, involves creating a melt zone through a limited cross section of a silicon rod and passing this melt zone along the length of the silicon rod. When the melt is initially contacted with a monocrystal silicon seed, the resulting ingot is composed of monocrystalline silicon. The float-zone process has not been generally applicable to forming monocrystalline silicon from particulate silicon due to the need to structure the silicon particles in a coherent mass defining an element along which a melt zone could be passed. The present invention solves this problem by use of a silicon conduit having one closed end of silicon, which can be formed into a replenishable melt zone.

By "silicon conduit" is meant a hollow cylinder of silicon open at one end and closed at the other by silicon. The silicon conduit can be formed from polycrystalline or monocrystalline silicon. It is preferred that the silicon conduit be of a purity comparable to that of the particulate silicon to be processed. The silicon conduit can be fabricated from, for example, polycrystalline semiconductor-grade silicon. The silicon from which the silicon conduit is formed can be of lessor purity, but this may result in contamination in the monocrystalline silicon product.

Although it is preferred that the silicon conduit have a cross-section in the shape of a circle, the cross-sectional shape is not limited to such. The cross-section shape could be, for example, an oval or of multifaceted design, such as square, rectangular, or hexagonal. The size of the silicon conduit will depend upon the limitations of the zoning apparatus employed and the size of the monocrystal of silicon desired.

A lower limit for the outer diameter of the silicon conduit is about 2 cm, with an inner diameter of about 1 cm. At an inner diameter of less than about 1 cm, capillary action tends to pull the melt zone up the silicon conduit wall causing plugging of the conduit. The upper size limit of the silicon conduit is dictated by the limitations of the zoning apparatus and the size of the monocrystal of silicon desired.

The thickness of the wall of the silicon conduit represents a compromise between maintaining a sufficient internal space to contain a melt of sufficient size to support the desired growth of a monocrystal of silicon and sufficient wall thickness to provide structural integrity to the silicon conduit. Within practical limitations, the thicker the wall, the better. In practice, wall thicknesses representing about 30 to 70 percent of the radius of the silicon conduit are useable. Preferred is when the wall thickness is about 50 percent of the radius of the silicon conduit.

It is preferred that the silicon conduit be mounted in a chuck that can be rotated. This allows rotation of the silicon conduit and melt zone during the process to reduce asymmetrical heating from the induction coil and to aid in distribution of particles being fed into the melt zone.

The instant process is started by forming a melt zone from the closed end of the silicon conduit. The melt zone can be formed by standard means employed in float-zone processing. The melt zone can be formed by, for example, radiation or induction heating. In a preferred process, the closed end of the silicon conduit is heated by radiation heating to a temperature at which induction coupling can be achieved with the closed end.

In the preferred process, the melt is formed by an inductive coupled radio frequency (RF) coil of conventional design. Within the size and power limitations of the float-zone apparatus, the size of the coil is further dictated by the preference that the inner diameter of the coil be less than the inner diameter of the silicon conduit.

The induction coil is positioned beneath the closed end of the silicon conduit, coupling established, and a melt zone established at the bottom of the silicon conduit. An appropriate seed crystal of silicon is positioned beneath the silicon conduit bottom to contact the melt.

The pulling of a monocrystal of silicon proceeds according to standard methods until the melt breaks through the bottom of the silicon conduit. As the melt breaks through the silicon conduit bottom, typically there is an initial surge of silicon melt expelled from the silicon conduit. This initial surge is controlled by reducing energy to the melt and a pulling away of the silicon seed crystal from the bottom of the silicon conduit until a stable size for the monocrystal of silicon has been achieved.

Once stability of the size of the monocrystal of silicon has been achieved, the process of pulling a crystal from the silicon melt proceeds according to standard methods for pulling a crystal from a melt. The initial seed crystal can be polycrystalline or monocrystalline in nature. Those skilled in the art will recognize that the present process can be employed using either a polycrystalline seed or a monocrystal seed, the only difference being the crystal structure of the resulting silicon element. Preferred is a monocrystal of silicon as a seed to produce a monocrystalline silicon ingot. To minimize dislocations in the formed monocrystalline silicon ingot, it is preferred that the seed crystal be "necked" to a small diameter by standard techniques. To avoid dislocations in the growing monocrystal, it is preferred that the initial segment of monocrystalline silicon grown from the seed crystal be narrow in diameter, with subsequent expansion of the monocrystalline silicon ingot to the desired size. The diameter of the monocrystal of silicon can be larger than the diameter of the silicon conduit. Therefore, the diameter of the monocrystal of silicon is not limited by the ability to form polycrystalline rods, as required by prior art. The described process makes possible the production of monocrystalline ingots larger in both diameter and/or length than those currently possible using a polycrystalline rod as a starting material to the float-zone refiner.

The instant process allows longer monocrystalline silicon ingots to be produced for a given height of the float-zone apparatus chamber. This advantage is achieved in float-zoner apparatus utilizing a stationary heating element through which a polycrystalline rod is passed. With the current process, there is not a need for a separate chamber portion to hold an unprocessed polycrystalline silicon rod.

The silicon melt is maintained by feeding particulate silicon to the melt zone through the silicon conduit. Any standard means for feeding a particulate material, at a controlled rate, can be used for this purpose. In a preferred embodiment of the instant invention, a hopper with a means for delivering a controlled rate of particulate silicon is positioned above a float-zone apparatus. The hopper is connected to the float-zone apparatus by a connecting tube, which passes through an airtight seal in the top of the float-zone apparatus. It is preferred that the connecting tube be formed from a non-contaminating material, for example, teflon, silicon, or a metal or metal alloy such as stainless steel lined with a non-contaminating material such as silicon or teflon.

The connecting tube is extended down the center of a hollow chuck used to retain and position the silicon conduit within the float-zone apparatus. Within the hollow of the chuck, the connecting tube is connected to a non-contaminating delivery tube which extends downward into the silicon conduit.

The delivery tube may be an extension of the connecting tube and need not be a separate unit. The delivery tube can be formed from materials similar to those described for the connecting tube. In a preferred embodiment, the delivery tube is positioned radially in about the center of the silicon conduit and its vertical position is established as close to the melt zone as possible without causing inductive coupling between the RF coil and the delivery tube.

The size of the connecting tube and delivery tube is not critical to the instant invention. In general, it is desired that the tubes be large enough to allow free flow of the particulate silicon at rates adequate to replenish silicon being withdrawn from the melt zone.

The rate of feed of particulate silicon to the melt zone is controlled at a rate to maintain an essentially constant volume for the silicon melt zone. Control may be achieved either by continuous feed of particulate silicon or pulse feeds of particulate silicon to the melt zone. By "controlled rate" to "maintain an essentially constant volume" is meant, the feed rate of particulate silicon to the melt zone is adequate to maintained a melt volume that allows continuous withdrawal of a monocrystal of silicon from the melt, without an excessive accumulation of melt within the silicon conduit. A feed rate which exceeds the capacity of the melt to incorporate the particulate silicon can result in bridging across the silicon conduit. Therefore, it is necessary to coordinate the pull rate of the monocrystal of silicon and the feed rate of the particulate silicon.

The described process is especially appropriate for float-zone processing of particulate silicon of semiconductor grade purity. However, particulate silicon of lessor purity can also be processed, for example, solar-grade silicon. The size requirements for the particulate silicon will depend primarily upon the inner diameter of the silicon conduit and the ability of the melt to incorporate the silicon particles. Any particle size which can be successfully transported into the silicon conduit at a controlled rate without clogging the silicon conduit or causing bridging of the silicon conduit is useable. Generally particle sizes of about 10 $\mu$m to 10.000 $\mu$m are considered useable. Preferred is when the silicon particle size is in the range of about 10 $\mu$m to 1000 $\mu$m. The most preferred silicon particles are those of semiconductor-grade purity made in a chemical vapor deposition type fluid-bed process, the particles having a diameter of about 200 $\mu$m to 1.000 $\mu$m.

After the monocrystal of silicon has been pulled to the desired length, it is preferred that the melt within the silicon conduit be allowed to solidify thereby providing a reusable silicon conduit for repeating the described process to form additional monocrystals of silicon. In the preferred process power is reduced to the melt and as the melt begins to solidify the monocrystal of silicon is further drawn so as to create an attenuated region which can be easily cut to separate the monocrystal of silicon and the silicon conduit.

So that those skilled in the art may better appreciate the process described herein, the following example is offered. This example is offered for illustrative purposes and is not intended to limit the scope of the claims.

EXAMPLE

A monocrystalline silicon ingot was produced by feeding particulate silicon through a silicon conduit terminating in a melt zone. The process was conducted in a 5 kW R. F. generator, Gas Siemens Zoner (Model VZA-3, Siemens Energy and Automation, Inc.. East Brunswick, N.J.). The Siemens Zoner was modified to include a stainless steel feed tube. The feed tube was connected to an AccuRate Model 106 dry material feeder (AccuRate Inc., Whitewater, Wis.), which was used as a hopper to provide a controlled feed of particulate silicon to the Siemens Zoner.

A silicon conduit was prepared from a polycrystalline silicon rod measuring 27 mm in diameter and 30 mm in length. The rod was hollowed to within 7 mm of a bottom end using a 19 mm diameter diamond-tipped coring bit. The result of this process was a hollow silicon vessel with walls about 5–7 mm in thickness and closed on one end. A 15 mm by 15 mm section was cut out of the top of the silicon conduit wall to create a window to allow visual inspection of the inside of the conduit during conduct of the process. The silicon conduit was acid etched and exhaustively rinsed in distilled water prior to use.

The open end of the cleaned silicon conduit was mounted in the chuck of the Siemens Zoner. One end of the stainless steel conduit, connecting the hopper to the Siemens Zoner, was attached to a quartz tube which extended into the hollow space of the chuck. The particulate silicon was allowed to fall from the quartz tube into the silicon conduit retained in the chuck.

The closed bottom of the silicon conduit was heated by radiation heating to a temperature at which inductive coupling could be achieved between the silicon conduit and a radio frequency (RF) coil. The RF coil was a conventional design three turn, copper coil of pancake design, with an inner diameter of 12 mm. The RF coil was positioned at the bottom of the silicon conduit and inductive coupling achieved at a frequency of about 3.5 Hz.

Formation of a silicon melt bubble on the exterior bottom of the silicon conduit was effected by standard zoning techniques. Once the silicon melt bubble was formed, a monocrystal silicon seed attached to the moveable stage of the zoner was brought into contact with the silicon melt bubble and the formation of a monocrystalline silicon ingot initiated. The interior bottom of the silicon conduit was observed through the prepared window to monitor the melting of the interior of the silicon conduit bottom. Complete melting of the bottom of the silicon conduit resulted in a surge of molten silicon exiting the silicon conduit. Control of this surge of molten silicon was effected manually by a combination of reducing power to the melt area and adjusting the pull rate of the monocrystalline silicon ingot. Once control of the crystal size was stabilized, the RF power and coil position were adjusted to achieve a parabolic shaped melt puddle extending across the interior of the silicon conduit.

As soon as the crystal size was stabilized, the feed of particulate silicon into the melt zone was commenced by means of the attached hopper. The particulate silicon feed was a granular polycrystalline silicon prepared in a fluid-bed reactor. The particulate silicon was screened to a size of about 500 μm to 1000 μm diameter prior to addition to the feed hopper. The feed of particulate silicon, power to the RF coil, and crystal pull rate where controlled so as to maintain a parabolic shaped melt puddle within the silicon conduit while pulling a crystal of consistent size.

Under stable operating conditions, the pull rate for the crystal was about 2 mm per minute and the feed rate of particulate silicon to the melt was about 0.075 grams per minute.

At the completion of the process, the pulled monocrystal of silicon was separated from the melt and the melt allowed to solidify to reform the bottom of the silicon conduit and allow the silicon conduit to be reused. A crystal measuring about 8 cm in length and 5 mm in diameter was prepared.

What is claimed is:

1. A float-zone process for preparation of monocrystalline silicon from particulate silicon, the process comprising:
    (A) feeding particulate silicon, through a silicon conduit contacted with a silicon melt zone, at a feed rate controlled to maintain an essentially constant volume for the melt zone,
    (B) contacting the silicon melt zone with a monocrystal silicon seed, and
    (C) withdrawing the monocrystal silicon seed from the silicon melt zone at a rate effective for growing a monocrystalline silicon ingot from the silicon melt zone.

2. A process according to claim 1, where the monocrystalline silicon ingot is greater in diameter than the silicon conduit.

3. A process according to claim 1, where the particulate silicon is made in a chemical vapor deposition type fluid-bed process.

4. A process according to claim 1, where the monocrystalline silicon ingot is of semiconductor-grade purity.

5. A float-zone process for preparation of a silicon ingot from particulate silicon, the process comprising:
    (A) feeding particulate silicon, through a silicon conduit contacted with a silicon melt zone, at a feed rate controlled to maintain an essentially constant volume for the silicone melt zone,
    (B) contacting the silicon melt zone with a silicon seed, and
    (C) growing a silicon ingot, by withdrawing the silicon seed from the silicon melt zone at a controlled rate effective for growing a silicon ingot from the silicon melt zone.

6. A process according to claim 5, where the silicon ingot is greater in diameter than the silicon conduit.

7. A process according to claim 5, where the particulate silicon is made in a chemical vapor deposition type fluid-bed process.

8. A process according to claim 5, where the silicon ingot is of semiconductor-grade purity.

9. A process according to claim 1, where size of the monocrystalline silicon ingot is not limited by size of a polycrystalline silicon rod.

* * * * *